United States Patent [19]

Finney

[11] Patent Number: 5,014,101

[45] Date of Patent: May 7, 1991

[54] SEMICONDUCTOR IGBT WITH IMPROVED TURN-OFF SWITCHING TIME

[75] Inventor: Adrian D. Finney, Birmingham, England

[73] Assignee: Lucas Industries Public Limited Company, Birmingham, England

[21] Appl. No.: 466,946

[22] Filed: Jan. 18, 1990

[30] Foreign Application Priority Data

Jan. 21, 1989 [GB] United Kingdom ............. 8901342

[51] Int. Cl.⁵ .................. H01L 29/00; H01L 29/72; H01L 29/74; H01L 29/747
[52] U.S. Cl. .............................. 357/37; 357/36; 357/38; 357/39
[58] Field of Search ............. 357/385, 22 GR, 36, 357/13 U, 24 A, 37, 43, 46, 36, 37, 38, 39, 38.5, 43

[56] References Cited

FOREIGN PATENT DOCUMENTS

| 0010970 | 2/1981 | Japan | 357/38.5 |
| 0050565 | 5/1981 | Japan | 357/38.5 |
| 0198777 | 9/1986 | Japan | 357/36 |
| 2625917 | of 1976 | Sweden | 357/38 |

OTHER PUBLICATIONS

Modern Power Devices, B. Jayant Baliga, 1987.

Primary Examiner—Rolf Hille
Assistant Examiner—Mahshid Saadat
Attorney, Agent, or Firm—Nixon & Vanderhye

[57] ABSTRACT

An insulated gate bipolar transistor comprises a body of semiconductor material having four layers of alternate conductivity-type disposed between emitter and collector electrodes and an insulated gate for establishing charge carrier flow to a base region of the device adjacent the emitter region, the device further comprising a conductive path enabling charge carriers to flow from the emitter region to the base region upon turn-off. As a result the device exhibits an improved speed of turn-off.

9 Claims, 3 Drawing Sheets

SEMICONDUCTOR IGBT WITH IMPROVED TURN-OFF SWITCHING TIME

BACKGROUND OF THE INVENTION

1. Field of the Invention

This invention relates to a semiconductor device and more particularly to a power switching device in the form of an insulated gate transistor with improved speed of turn-off.

2. Discussion of the Prior Art

An insulated gate transistor comprises four layers or regions of alternate conductivity-type semiconductor material disposed between an emitter electrode and a collector electrode. A gate electrode is positioned adjacent the collector electrode but is insulated from the body of semiconductor material. The two intermediate regions extend to the surface of the semiconductor body underneath the insulated gate and the intermediate layer closer to this surface extends to the collector electrode. When an appropriate potential is applied to the gate electrode, the electric field which is created serves to drive away majority carriers from and attract minority carriers to a nearby zone of that intermediate region thus creating an inversion channel through which charge carriers can pass between the adjacent regions. The device is thus switched on and current flows between the emitter and collector electrodes.

This insulated gate transistor is however slow to turn-off when the gate potential is removed. This is because at turn-off, a large number of charge carriers are present in the base region (the region adjacent the emitter region) and the current decays as these disperse. The turn-off speed can be improved by providing so-called lifetime killers or recombination centres in the base region. Such recombination centres can be introduced either by doping with interstitial impurities (e.g. gold) or by radiation damage but each of these techniques is expensive. Further, the provision of recombination centres introduces two other problems, firstly that the device is leaky (i.e. a relatively high leakage current flows between collector and emitter when the device is "off"), and secondly that the device exhibits a relatively high onstate voltage drop owing to the disrupted lattice. Moreover, even with recombination centres, the turn-off is still relatively slow.

SUMMARY OF THE INVENTION

We have now devised an insulated gate transistor which overcomes these problems to provide a device with improved turn-off speed without requiring recombination centres.

In accordance with this invention, there is provided an insulated gate bipolar transistor comprising a body of semiconductor material having four layers of alternate conductivity-type disposed between emitter and collector electrodes and an insulated gate for establishing charge carrier flow to a base region of the device adjacent the emitter region, the device further comprising a conductive path enabling charge carriers to flow from the emitter region to the base region upon turn-off.

The device is thus a vertical device, in that the main current path extends through the body of semiconductor material between the emitter and collector electrodes on opposite surfaces of that body. Preferably the conductive path extends at least in part over the outer surface of the body of semiconductor material. The conductive path is relatively straightforward to provide on the outer surface of the semiconductor body yet efficiently ensures that charge carriers in the base region recombine at turn-off. The device avoids the need for recombination centres in the base region.

Preferably the base region of the device is an epitaxial layer grown on a substrate which forms the emitter region. The conductive path may be disposed on the top surface of the device or on its edge surface.

In one embodiment, with say an n-type base region, an n+ sub-region is formed in the base region at the top surface of the device and a conductive short is provided on this surface to a p+ link which runs through the epitaxial layer of the device to the p+ substrate or emitter region.

In another embodiment, the n+ sub-region includes a grid formed in the n-type base region at its junction with the p+ substrate. The sub-region includes a link extending from the grid to the top surface of the device and a conductive short is provided on this surface to a p+ link which runs through the epitaxial layer of the device to the p+ substrate.

In a further embodiment, an n+ sub-region is formed in the base region at its junction with the substrate and adjacent the edge of the device. The conductive short is provided over the edge of the device between this n+ sub-region and the p+ substrate. In a modification of this embodiment, the n+ sub-region includes a grid in the base region, at its junction with the substrate or emitter region.

Embodiments of this invention will now be described by way of examples only and with reference to the accompanying drawings, in which:

DETAILED DESCRIPTION OF PREFERRED EMBODIMENTS

Figure 1:
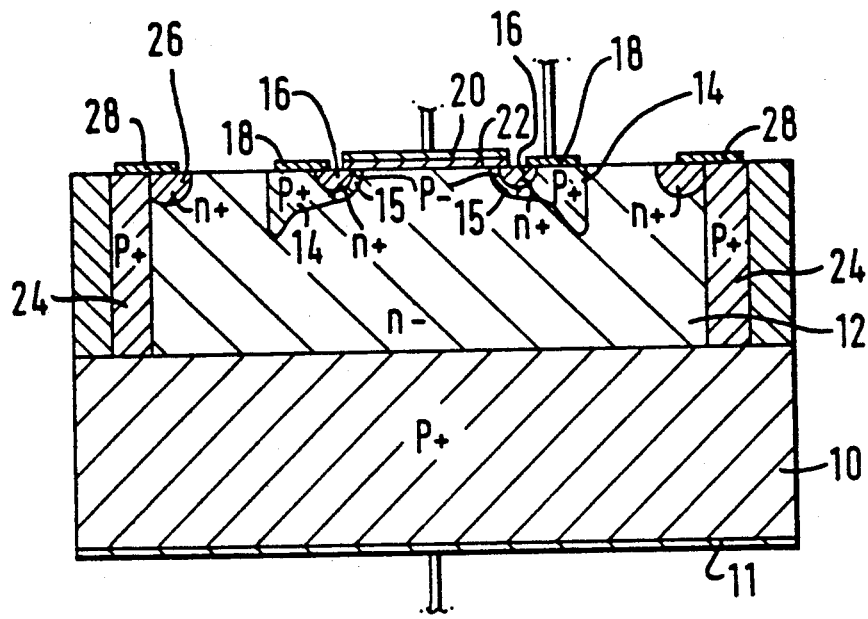
FIG. 1 is a diagrammatic section through an embodiment of insulated gate transistor in accordance with this invention.

Referring to FIG. 1 of the drawings, there is shown a silicon insulated gate transistor which comprises a p+ substrate or emitter region 10, on which a relatively thin epitaxial n— base layer 12 is grown. An emitter or anode electrode 11 is applied to the lower surface of the device, i.e. the outer surface of the emitter region. An annular p+ region 14 is formed in the base layer 12 at the top surface of the device by diffusion and an annular n+ region 16 is formed in the region 14 at the top surface by ion implantation or by diffusion. An annular collector or cathode electrode 18 is applied to the top surface of the device over the junction between the p+ and n+ regions. A gate electrode 20 is applied to the top surface of the device, but is insulated therefrom by an insulating layer 22, so as to cover the central zone of the base region 12 and to extend over the narrow annulus of a p− region 15 between the central zone of the base region and the n+ region 16.

The structure so far described is that of an insulated gate transistor. In use, with a potential applied to the anode electrode 11 which is more positive than the potential applied to the cathode electrode 18, then a positive potential can be applied to the gate electrode 20 to turn the device on. In particular, the electric field created around the gate electrode drives majority charge carriers away from and attracts minority carriers into the narrow annulus of the p− region 15 between the central zone of the base and the n+ region 16, so as to create an inversion channel through this narrow annulus. Carriers then flow along this channel from the n+ region 16 to the base, with the effect of turning the device on for flow of current between the anode and cathode electrodes. In order to turn the device off, the potential is removed from the gate electrode 20 and the inversion channel disappears to prevent further flow of charge carriers into the base region. However, in order to terminate quickly the current flow between the anode and cathode electrodes, there is a need for charge carriers in the base region 12 to recombine quickly.

In accordance with this invention, the use of recombination centres in the base region is avoided. Instead, a conductive path is provided from the base region 12 to the emitter region or substrate 10. In the examples shown, this conductive path extends in part over the outer surface of the base region and in part comprises a diffusion into or through the base region, and is therefore straightforward to provide.

In the device shown in FIG. 1, this conductive path is provided as follows. A p+ region or link 24 is formed by diffusion through the base region 12 around the periphery close to the edge surface of the device, this region 24 extending from the top surface of the device to the substrate 10. An annular n+ region 26 is also formed by diffusion into the base region at the top surface of the device, adjacent the p+ link region 24. A conductive short 28 (e.g. a metal layer) is applied to the top surface of the device, bridging the regions 26 and 24. In use, when the device is turned off, minority charge carriers remaining in the base region 12 are able to recombine quickly with carriers introduced via the conductive path from the emitter region 10.

Figure 2:
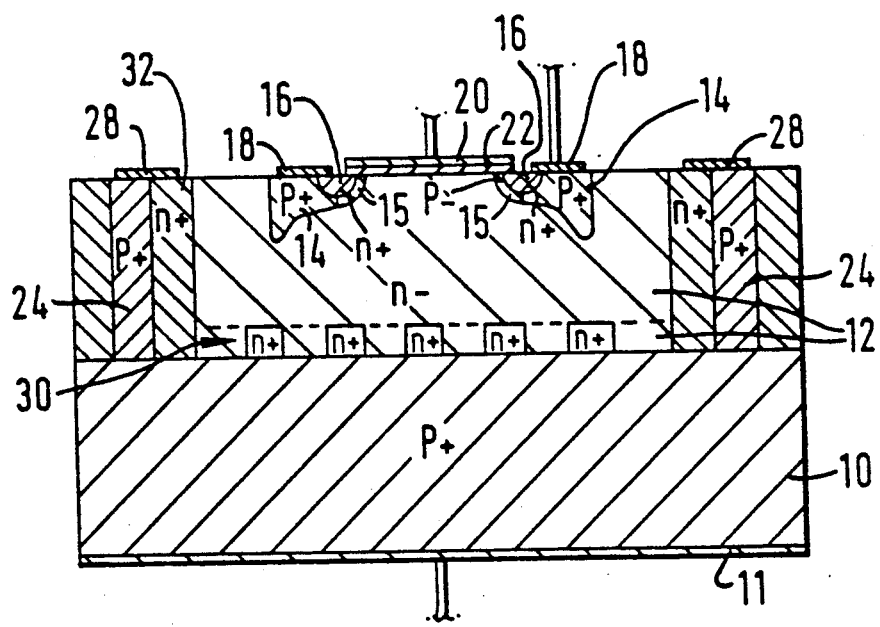
FIG. 2 is a similar section through another embodiment of insulated gate transistor in accordance with this invention.

Referring to FIG. 2, there is shown another embodiment of an insulated gate transistor in accordance with this invention. This device is basically similar to the device shown in FIG. 1 and like parts are given like reference numerals. In the device of FIG. 2 however, an n+ grid 30 is formed in the base region 12 at its junction with the emitter region or substrate 10. The p+ link region 24 is still provided through the base region of the device and extends from the top surface to the substrate 10, but the peripheral element 32 of the grid 30 extends to the top surface of the device and lies adjacent the p+ link region 24. The conductive short 28 is still applied to the top surface of the device, bridging the element 32 of the n+ grid and the p+ link region 24. In this device, at turn-off charge carriers in the base region 12 are able to recombine quickly with carriers introduced over the conductive path to the nearby elements of the buried grid 30. A thin n+ layer may replace the grid 30.

Figure 3:
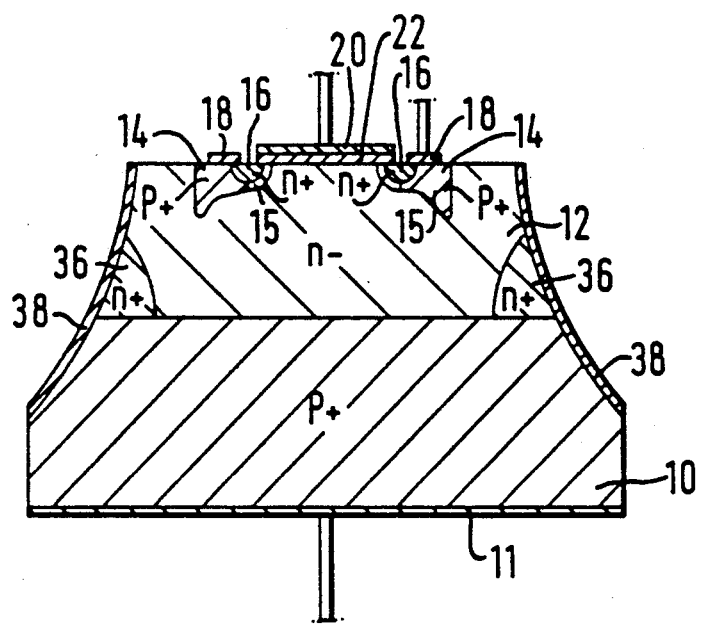
FIG. 3 is a similar section through a further embodiment of insulated gate transistor in accordance with this invention.

Referring to FIG. 3 of the drawings, there is shown a further embodiment which comprises a p+ substrate 10, anode electrode 11, epitaxial n− base region 12 and gate and cathode structure similar to the device of FIG. 1. In the device of FIG. 3 however, the conductive path from the base region 12 to the substrate 10 is provided as follows. An n+ region 36 is formed in the base region 12 around the periphery of the device and at the junction of the base region 12 with the substrate 10. A conductive e.g. metal layer 38 is applied to the edge of the device over the n+ region 36, over the base region 12 and over the top portion of the substrate 10. In this device, at turn-off charge carriers remaining in the base region 12 quickly recombine with carriers introduced via the conductive path.

Figure 4:
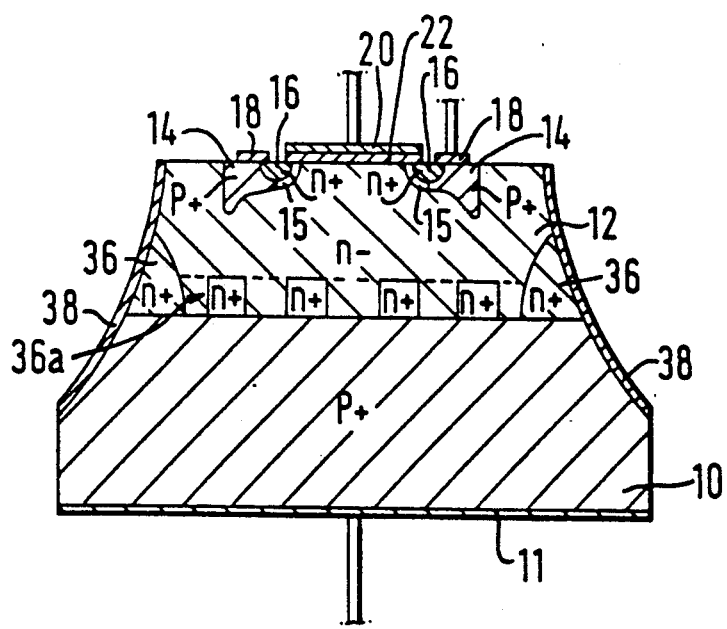
FIG. 4 is a similar section through a yet further embodiment of the insulated gate transistor in accordance with this invention.

In the modified device shown in FIG. 4, the n+ region 36 is formed as a peripheral portion of a buried grid in the base region 12 at its junction with the substrate. The charge carriers remaining in the base region at turn-off quickly recombine with carriers introduced via the conductive path and the nearby elements of the buried grid. The central portion 36a of this n+ region may comprise a thin layer instead of a grid.

Figure 5A:
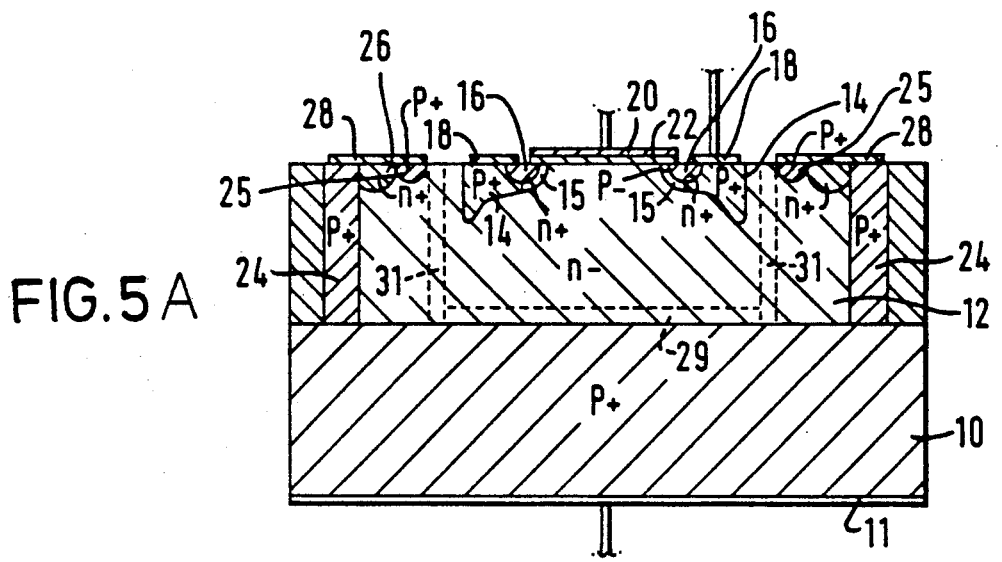
FIG. 5 is a section through a modification of the device of FIG. 1 and includes a perspective view of a part thereof.
Figure 5B:
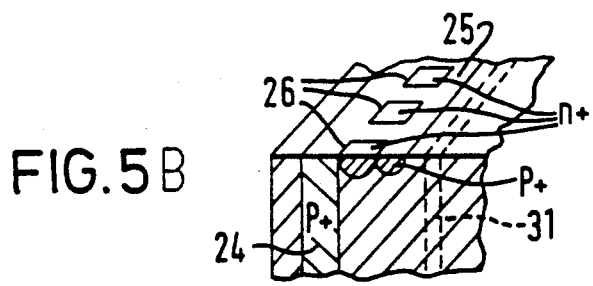
Figure 6A:
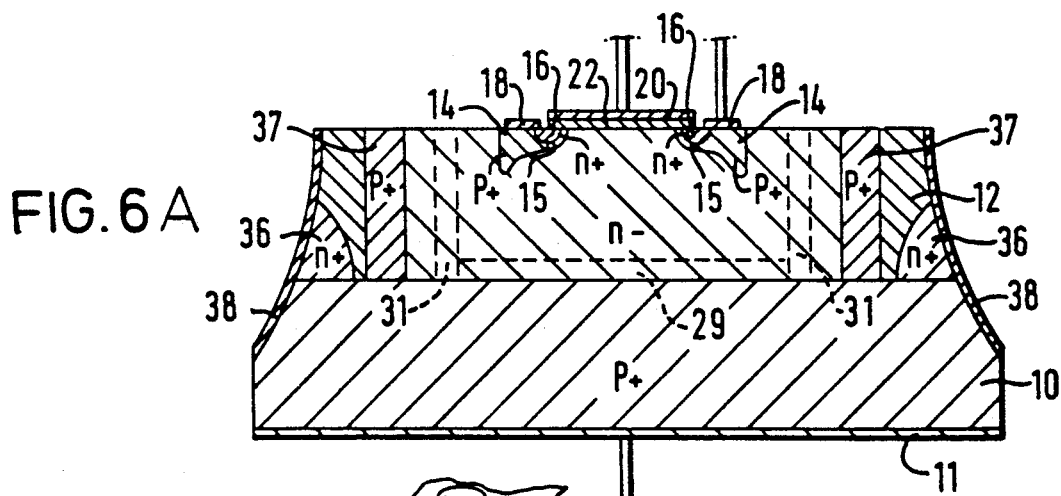
FIG. 6 is a section through a modification of the device of FIG. 3 and includes a perspective view of a part thereof.
Figure 6B:
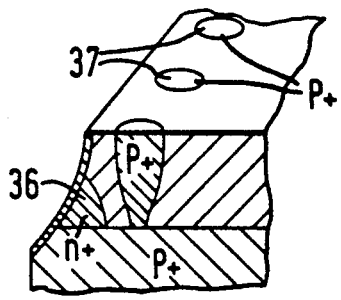

The devices shown in FIGS. 5 and 6 have, additionally, a reverse blocking capability. The device of FIG. 5 is a modification of the device of FIG. 1, in which the p+ link region 24 is extended by a layer 25 at the top surface of the device, which extends inwardly towards the collector, and the n+ region 26 is formed at discrete locations through this layer 25. The conductive short 28 covers the layer 25 and top of the link 24 and the discrete elements of region 26. The device of FIG. 6 is a modification of the device of FIG. 3, in which a plurality of discrete p+ regions 37 are formed through the base 12 from the top of the device to the emitter region 10, the regions 37 being spaced apart from each other and positioned between the n+ region 36 and the collector. When the devices of FIGS. 5 or 6 are reverse biassed, a depletion layer is created in the base region 12 and across the n+ region 26 or 36, so interrupting the conductive path between the emitter region 10 and the base region 12 via the conductive short 28 or 38.

Dotted lines in FIGS. 5 and 6 indicate further features which may be included in those devices, and which may be included in the devices of FIGS. 1 and 3. Thus, a grid or thin layer 29 of n+ conductivity may be formed in the base region 12 at its junction with the emitter region 10. A grid or thin layer 31 of tubular shape and n+ conductivity may also extend from grid or layer 29 to the top surface of the device, around the collector. The grid or thin layer 31 reduces the resistance between the central portion of the base region 12 and the portion of the base region adjacent the n+ region 26 or 36.

Whilst the devices which have been described have a p type substrate, they may instead have an n type substrate (in which case all other regions would be of opposite conductivity type from those indicated).

Whilst certain regions have been described as being annular, it will be appreciated that alternative closed-loop shapes may be employed, e.g. of square or rectangular shape.

The devices with conductive shorts which have been described exhibit improved switching speed because of the conductive path provided between the base region and substrate for the flow of charge carriers at turn-off. The off-state leakage of these device is comparable with bipolar transistors. The devices have improved tolerance to high temperatures and lower on-state resistance as compared with prior art insulated gate transistors. The devices of FIGS. 5 and 6 have, additionally, a reverse blocking capability.

What is claimed is:

1. An insulated gate bipolar transistor, comprising a body of semiconductor material, emitter and collector electrodes disposed on said body of semiconductor material, said body of semiconductor material having four regions of alternate conductivity type disposed between said emitter and collector electrodes including an emitter region adjacent the emitter electrode, and a base region adjacent the emitter region, the device further comprising an insulated gate for establishing charge carrier flow to said base region to turn the device on for flow of current between the emitter and collector electrodes, and a conductive path enabling charge carriers to flow from the emitter region to the base region upon turn-off.

2. An insulated gate bipolar transistor as claimed in claim 1, in which said body of semiconductor material has an outer surface and conductive means extending over said outer surface, through which means said conductive path extends.

3. An insulated gate bipolar transistor as claimed in claim 1, in which said base region comprises at least one sub-region formed by diffusion, through which sub-region said conductive path extends.

4. An insulated gate bipolar transistor as claimed in claim 1, in which said base region comprises a first subregion of the same conductivity type but with higher impurity concentration, said body of semiconductor material has a surface to which said sub-region extends, and a conductive short extends over said surface from said sub-region to said emitter region.

5. An insulated gate bipolar transistor as claimed in claim 4, in which the base region comprises a sub-region of the same conductivity type as the emitter region and arranged to extend a depletion layer in the base region and across said first sub-region when the device is reverse biassed, to interrupt said conductive path.

6. An insulated gate bipolar transistor as claimed in claim 4, in which said first sub-region comprises a portion having a formation selected from a grid and a thin layer and disposed at the junction between the base region and emitter region.

7. An insulated gate bipolar transistor as claimed in claim 4, in which said base region comprises a second sub-region extending through it from said emitter region to said surface adjacent the first sub-region, the second sub-region being of the same conductivity type as the emitter region and the conductive short extending over said surface between said first and second sub-regions.

8. An insulated gate bipolar transistor as claimed in claim 7, in which the base region comprises a sub-region of the same conductivity type as the emitter region and arranged to extend a depletion layer in the base region and across said first sub-region when the device is reverse biassed, to interrupt said conductive path.

9. An insulated gate bipolar transistor as claimed in claim 7, in which said first sub-region comprises a portion having a formation selected from a grid and a thin layer and disposed at the junction between the base region and emitter region.

* * * * *